(12) United States Patent
Nakajima

(10) Patent No.: US 7,714,388 B2
(45) Date of Patent: May 11, 2010

(54) SEMICONDUCTOR MEMORY DEVICE AND MANUFACTURING METHOD THEREOF

(75) Inventor: Hiroomi Nakajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 139 days.

(21) Appl. No.: 11/563,889

(22) Filed: Nov. 28, 2006

(65) Prior Publication Data

US 2007/0210383 A1    Sep. 13, 2007

(30) Foreign Application Priority Data

Mar. 13, 2006    (JP) ............................. 2006-067650

(51) Int. Cl.
*H01L 27/12*    (2006.01)
(52) U.S. Cl. ............................. 257/353; 257/E27.084; 257/E27.112
(58) Field of Classification Search ................. 257/353, 257/E27.084, E27.112
See application file for complete search history.

(56) References Cited

U.S. PATENT DOCUMENTS 7,309,626 B2 * 12/2007 Ieong et al. .................. 438/157
2006/0071259 A1 * 4/2006 Verhoeven .................. 257/299

FOREIGN PATENT DOCUMENTS

| JP | 2005-167132 | 6/2005 |
| JP | 2006-503440 | 1/2006 |
| WO | WO 2004/038770 A2 | 5/2004 |
| WO | WO 2005/119764 A1 | 12/2005 |

OTHER PUBLICATIONS

T. Tanaka, et al., "Scalability Study on e Capacitorless 1T-DRAM: From Single-gate PD-SOI to Dou ble-gate Fin DRAM", IEDM Tech Dig., pp. 919-922, 2004.*
T. Tanaka, et al., "Scalability Study on a Capacitorless 1T-DRAM: From Single-gate PD-SOI to Double-gate FinDRAM", IEDM Tech Dig., pp. 919-922, 2004.
U.S. Appl. No. 11/760,401, filed Jun. 8, 2007, Nakajima.

* cited by examiner

*Primary Examiner*—Davienne Monbleau
*Assistant Examiner*—Hajar Kolahdouzan
(74) *Attorney, Agent, or Firm*—Oblon, Spivak, McClelland, Maier & Neustadt, L.L.P.

(57) ABSTRACT

This discloser concerns a semiconductor device including an insulation layer; a FIN-type semiconductor layer provided on the insulation layer and including a floating body region in an electrically floating state and including a source region and a drain region at both sides of the floating body region; gate insulation films provided on both side surfaces of the floating body region; gate electrodes provided on both side surfaces of the floating body region via the gate insulation films; and a source electrode and a drain electrode respectively contacting with the upper surface of the source region and the drain region, wherein in the cross section of the FIN-type semiconductor layer in parallel with the surface of the insulation layer, a thickness of the FIN-type semiconductor layer in the floating body region is smaller than a thickness of the FIN-type semiconductor layer in the source and the drain regions.

7 Claims, 10 Drawing Sheets

SEMICONDUCTOR MEMORY DEVICE AND MANUFACTURING METHOD THEREOF

CROSS-REFERENCE TO RELATED APPLICATION

This application is based upon and claims the benefit of priority from the prior Japanese Patent Applications No. 2006-67650, filed on Mar. 13, 2006, the entire contents of which are incorporated herein by reference.

BACKGROUND OF THE INVENTION

1. Field of the Invention

The present invention relates to a semiconductor memory device and a method of manufacturing the same.

2. Related Art

There is available an FBC (floating body cell) memory device as a semiconductor memory device that is expected as a memory which replaces a DRAM. The FBC memory device has an N-type MOS transistor that has a floating body (hereinafter also referred to as a body region) on an SOI (silicon on insulator) substrate. The FBC memory device stores data "1" or data "0", depending on the number of holes stored in the body region. For example, when the FBC is an n-type FET, the FBC memory device sets a state of the presence of many holes in the body region as the data "1", and sets a state of the presence of few holes in the body region as the data "0".

In recent years, there has been developed an FBC memory device that has an FBC formed on an SOI substrate and has a back gate electrode provided on a supporting substrate. A back bias is applied to the FBC memory device from the back gate electrode, thereby the floating body region is fully depleted. The FBC memory device can also increase a signal voltage from a memory cell by controlling the back bias.

In order to control the back bias, it is preferable that a BOX (buried oxidation) layer has a small film thickness, such as 25 nm or smaller. Furthermore, in order to increase the signal amount which is difference between data "0" and data "1", it is preferable that the floating body region (a channel region), or an SOI layer, also has a small film thickness, such as 50 nm or smaller. However, the BOX layer usually has a film thickness of about 150 nm, and it is technically difficult to decrease the film thickness to 50 nm or below.

To solve the problem, a method of configuring the FBC with a FIN-type FET is considered. According to the FIN-type FET, gate electrodes can be provided at both sides of a fin. Therefore, the floating body can be fully depleted readily. The FIN-type FET does not require to be provided with a back gate electrode on the supporting substrate. Therefore, the BOX layer does not require a large film thickness.

However, when the FIN has a small thickness to sufficiently secure the signal amount, not only the floating body region but also source/drain regions have a small film thickness. When the source/drain regions have a small film thickness, a contact resistance in the source/drain regions becomes high. Impurity is usually implanted into the source/drain regions from above the FIN toward the upper surface of the FIN. In order to diffuse impurity in the total source/drain regions, annealing process is necessary for a long time or at a high temperature. This annealing process diffuses impurity in a channel region as well. Therefore, this has a problem of changing the characteristic of a memory cell (See T. Tanaka et al. "Scalability Study on a Capacitorless 1T-DRAM: From Single-gate PD-SOI to Double-gate FinDRAM" IEDM 04-919-04-923).

SUMMARY OF THE INVENTION

A semiconductor device according to an embodiment of the present invention comprises an insulation layer; a FIN-type semiconductor layer provided on the insulation layer and including a floating body region in an electrically floating state and including a source region and a drain region at both sides of the floating body region; gate insulation films provided on both side surfaces of the floating body region; gate electrodes provided on both side surfaces of the floating body region via the gate insulation films; and a source electrode and a drain electrode respectively contacting with the upper surface of the source region and the drain region, wherein in the cross section of the FIN-type semiconductor layer in parallel with the surface of the insulation layer, a thickness of the FIN-type semiconductor layer in the floating body region is smaller than a thickness of the FIN-type semiconductor layer in the source and the drain regions.

A method of manufacturing a semiconductor memory device according to an embodiment of the present invention, the semiconductor memory device including a FIN-type semiconductor layer provided on an insulation layer and including a floating body region in an electrically floating state and including a source and a drain regions at both sides of the floating body region respectively, the method comprises preparing a substrate having a semiconductor layer provided on the insulation layer; a first etching process to remove a semiconductor layer between the adjacent source and drain regions of the semiconductor layer; and a second etching process to remove a semiconductor layer between the adjacent floating body regions of the semiconductor layer.

DETAILED DESCRIPTION OF THE INVENTION

Hereafter, embodiments the present invention will be explained with reference to the drawings. Note that the invention is not limited by the embodiments.

Figure 1A:
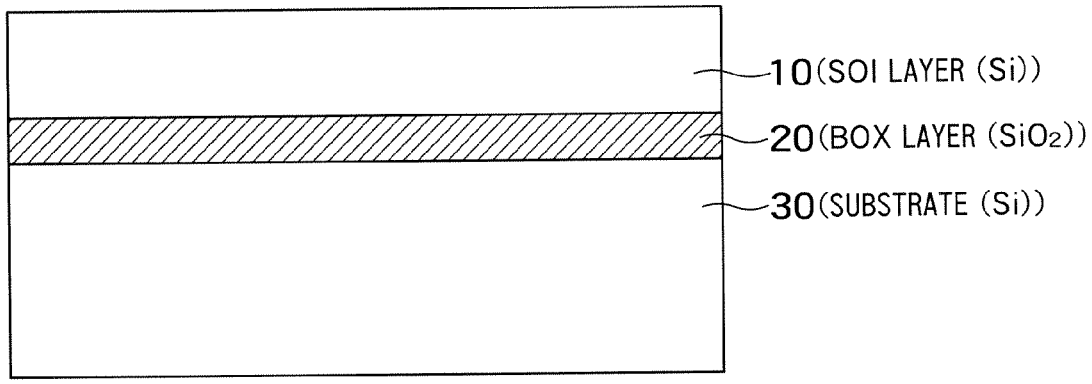
FIGS. 1A and 1B are a cross-sectional view and a top plan view showing a method of manufacturing a semiconductor memory device according to an embodiment of the present invention.

FIG. 1A to FIG. 12 are top plan views and cross-sectional views showing a method of manufacturing a semiconductor memory device according to an embodiment of the present invention. First, an SOI substrate as shown in FIG. 1A is prepared. The SOI substrate includes an SOI layer 10 as a semiconductor layer, a BOX layer 20 as an insulation film, and a supporting substrate 30. The SOI layer 10 is a P-type silicon monocrystal having an impurity concentration of about $1\times10^{16}$ cm$^{-3}$, for example, and having a film thickness of about 100 nm. The BOX layer 20 is a silicon oxide film having a film thickness of about 200 nm. The supporting substrate 30 is made of silicon monocrystal, for example, and can have any impurity concentration.

Figure 1B:
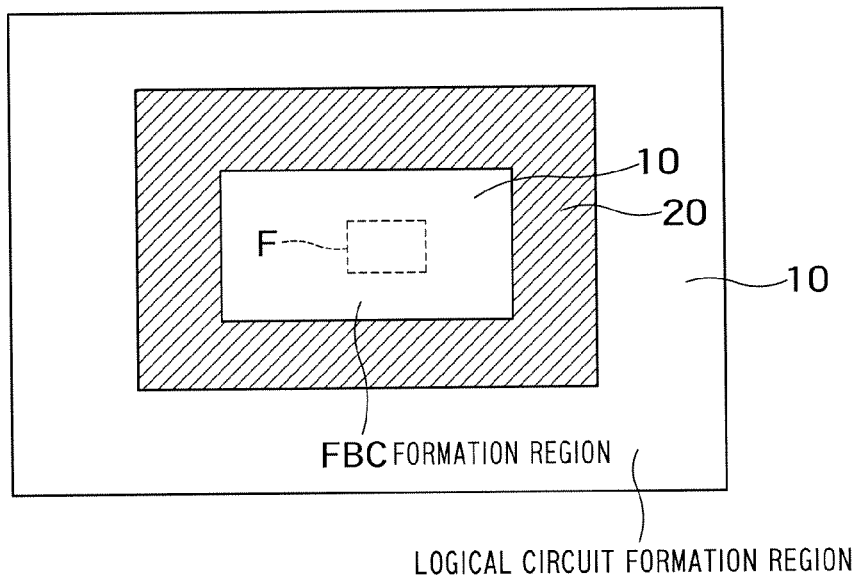

Next, as shown in FIG. 1B, in order to separate an FBC formation region from a logical circuit (a peripheral circuit) formation region, the SOI layer 20 that is present between these regions is selectively removed. FIG. 2A to FIG. 12 show top plan views and cross-sectional views of a part (a broken frame F) of the FBC formation region shown in FIG. 1B.

Figure 2A:
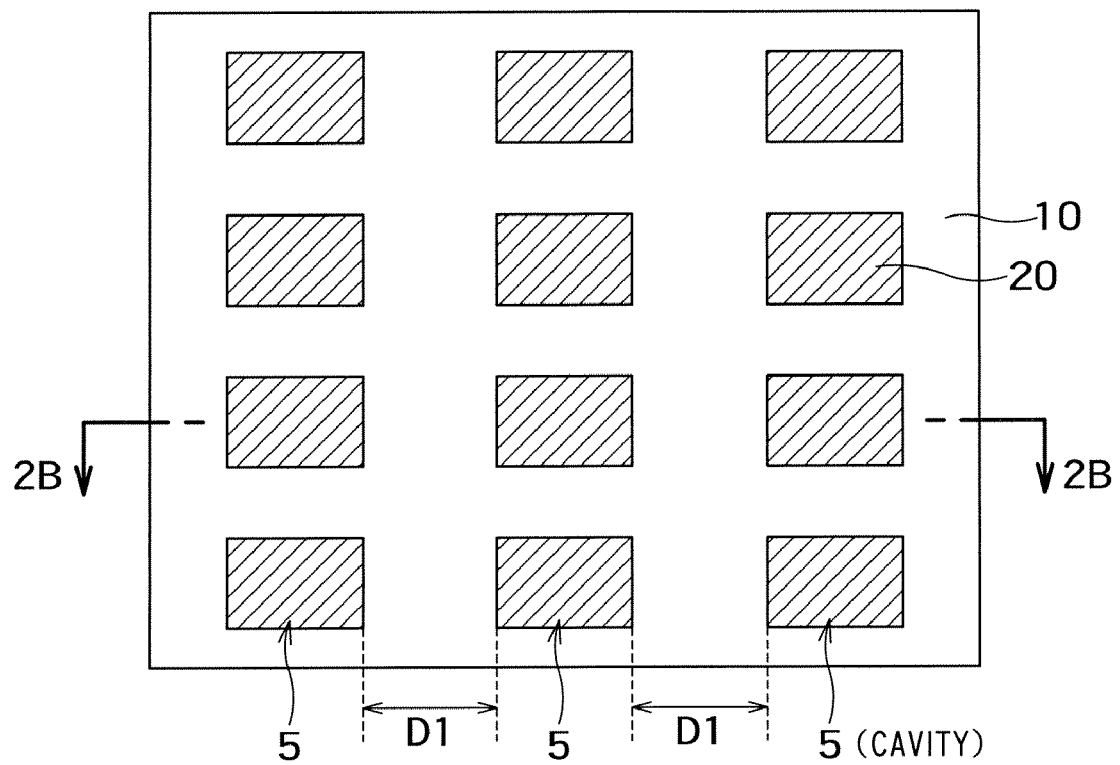
FIGS. 2A and 2B are a cross-sectional view and a top plan view showing a method of manufacturing a semiconductor memory device following FIGS. 1A and 1B.
Figure 2B:
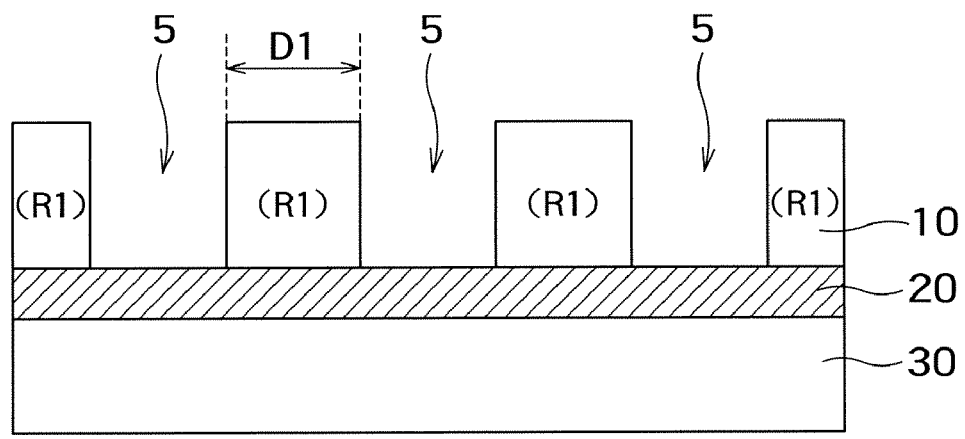

As shown in FIG. 2A, the SOI layer 10 is then etched into a mesh shape by using a photolithographic technique and a RIE (reactive ion etching) (a first etching process). In this first etching process, the SOI layer 10 is etched to form cavities 5 reaching to the BOX layer 20. A distance D1 is set between adjacent cavities 5. This difference D1 becomes a width (a thickness) of source/drain regions R1 of the FIN-type semiconductor layer. In other words, a width (a thickness) of source/drain regions R1 is determined in the first etching process. FIG. 2B is a cross-sectional view of the configuration shown FIG. 2A cut along a line 2B-2B.

Figure 3A:
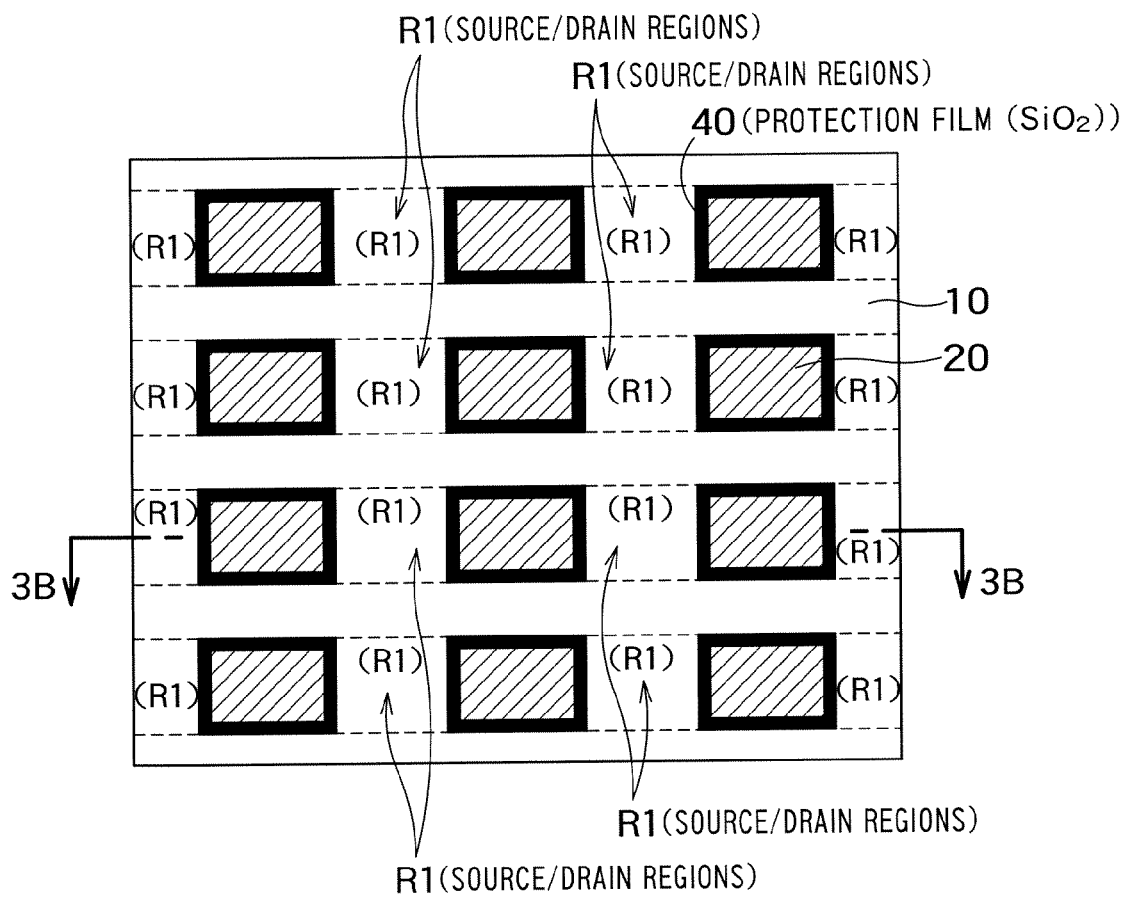
FIGS. 3A and 3B are a cross-sectional view and a top plan view showing a method of manufacturing a semiconductor memory device following FIGS. 2A and 2B.
Figure 3B:
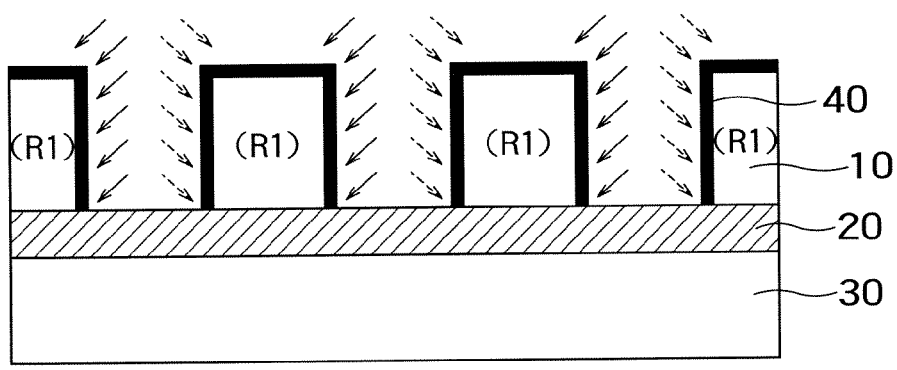

Next, the SOI layer 20 is thermally oxidized to form a protection film 40, as shown in FIG. 3A. The protection layer 40 consists of a silicon oxide film having a film thickness of about 20 nm. The protection film 40 is formed on the upper surface of the SOI layer 20 and side surfaces (side surfaces of the source/drain regions R1) of the SOI layer 20 facing the cavities 5. FIG. 3B is a cross-sectional view of the configuration being cut along a line 3B-3B in FIG. 3A.

After the protection film 40 is formed, an oblique ion implantation is performed to implant impurity for the source/drain regions at an implantation angle of about 45 degrees as shown in FIG. 3B. For example, ion is implanted into one side surface of source/drain regions R1, as shown by solid-line arrowheads in FIG. 3B, and next, ion is implanted into the other side surface of the source/drain regions R1, as shown by broken-line arrowheads. The impurity may be an N-type impurity, such as phosphorus and arsenic, having a concentration of about $1\times10^{15}$ cm$^{-3}$. By implanting impurity in an oblique direction, the impurity can be implanted into the source/drain regions R1 from the upper surface of these regions, and from the side surfaces of these regions.

Conventionally, a deep ion implantation of impurity substantially perpendicularly to the upper surface of an SOI layer before a FIN is formed. To diffuse and activate the impurity, an annealing process for a long time at a high temperature has been necessary.

However, in the present embodiment, after the source/drain regions R1 of the FIN are formed, an oblique ion implantation is performed. With this arrangement, according to the present embodiment, execution of a deep ion implantation and the annealing process for a long time at a high temperature is not necessary to form the source/drain regions R1. It is sufficient to anneal the substrate at a low temperature for a short time. As a result, impurity diffusion from the source/drain regions R1 to the channel region can be suppressed.

Figure 4A:
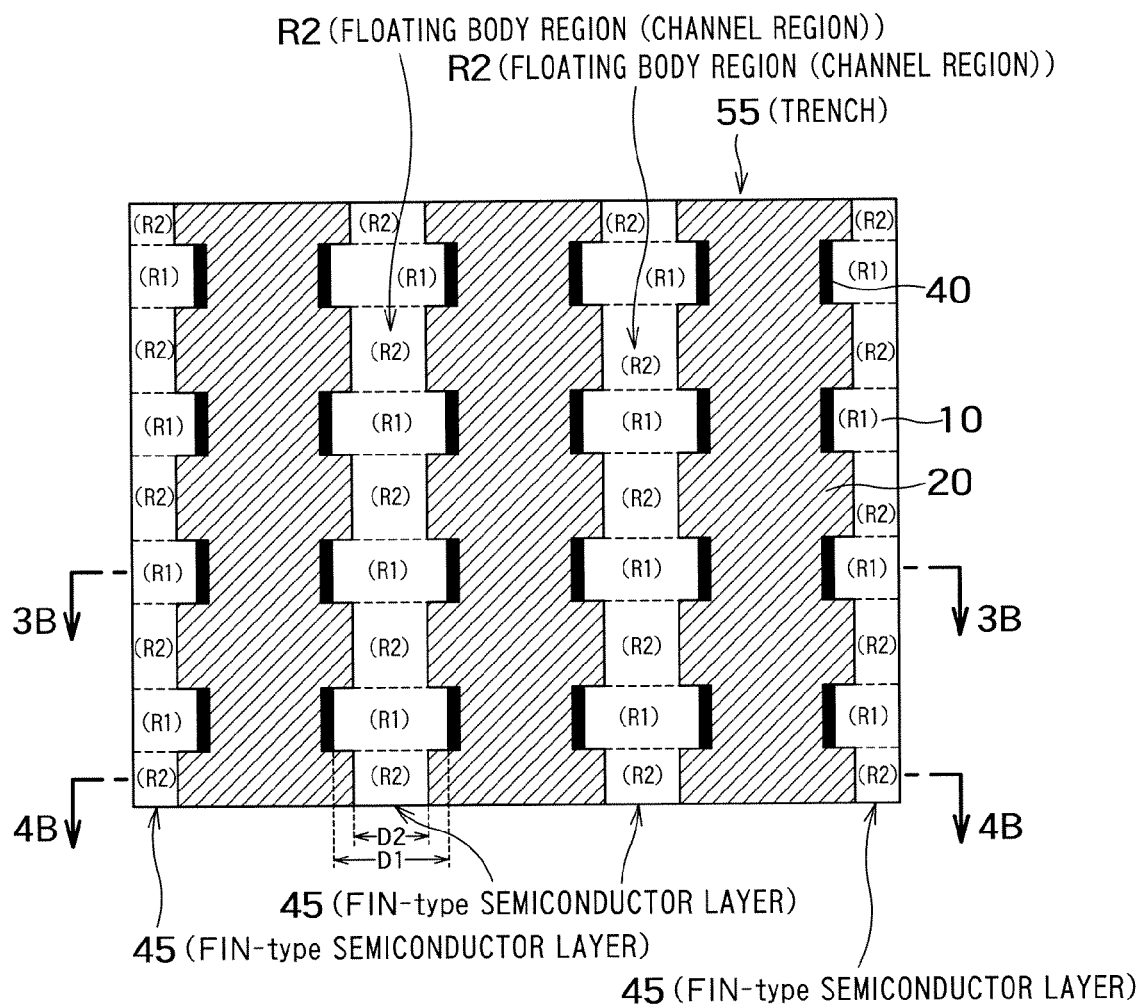
FIGS. 4A and 4B are a cross-sectional view and a top plan view showing a method of manufacturing a semiconductor memory device following FIGS. 3A and 3B.

Next, as shown in FIG. 4A, the SOI layer 20 between the cavities 5 is etched to form line-shaped FIN-type semiconductors 45 by using the photolithographic technique and RIE (a second etching process). In this second etching process, the cavities 5 are connected in a line shape, thereby forming trenches 55. Accordingly, the line-shaped FIN-type semiconductors 45 are formed between the trenches 55. In some cases, a silicon oxide film pillar (not shown) remains on the surface of the BOX layer 20 within the trenches 55. In this case, after the trenches 55 are formed, the silicon oxide film pillar is removed.

Figure 4B:
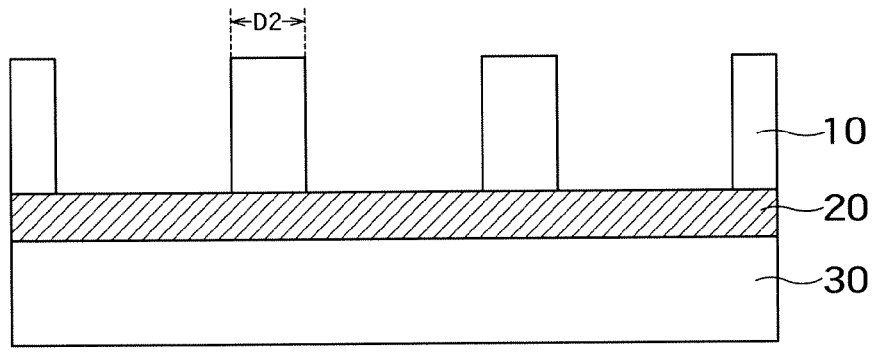

When a distance D2 is set between adjacent trenches 55, this distance D2 becomes a width (a thickness) of the floating body region R1 (a channel region) of the FIN-type semiconductor layer. In other words, a width (a thickness) of a channel region is determined in the second etching process. A cross-sectional view of the configuration shown in FIG. 4A cut along a line 3B-3B is similar to that shown in FIG. 3B. FIG. 4B shows a cross-sectional view of the configuration shown in FIG. 4A cut along a line 4B-4B.

As shown in FIG. 2B and FIG. 4B, the thickness D2 of the FIN-type semiconductor layer 45 in the floating body region R2 is smaller than the thickness D1 of the FIN-type semiconductor layer 45 in the source/drain region R1. This can be observed from the cross-sectional view (see FIG. 4A) of the FIN-type semiconductor layer 45 taken in parallel with the surface of the BOX layer 20. In the present embodiment, while the source/drain regions R1 and the floating body regions R2 are included in the same FIN-type semiconductor layer 45, the source/drain regions R1 and the floating body regions R2 are formed in separate processes. With this arrangement, the width (the thickness) D1 of the source/drain region R1 and the width (the thickness) D2 of the floating body region R1 can be differentiated, as shown in FIG. 2B and FIG. 4B. According to the present embodiment, when the width (the thickness) D1 of the source/drain region R1 is set relatively large, a contact resistance of the source/drain region R1 becomes small. On the other hand, when the width (the thickness) D2 of the floating body region R1 is set relatively small, the amount of signal from the memory cell can be increased.

Figure 5A:
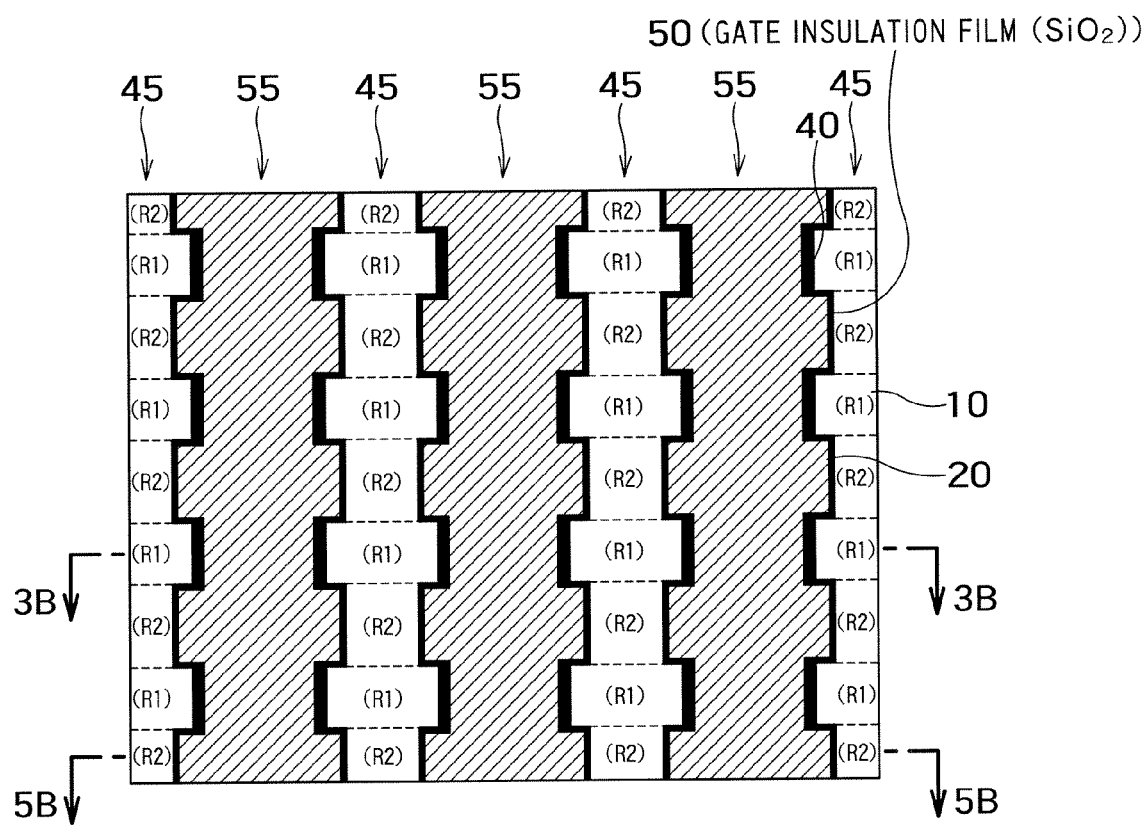
FIGS. 5A and 5B are a cross-sectional view and a top plan view showing a method of manufacturing a semiconductor memory device following FIGS. 4A and 4B.
Figure 5B:
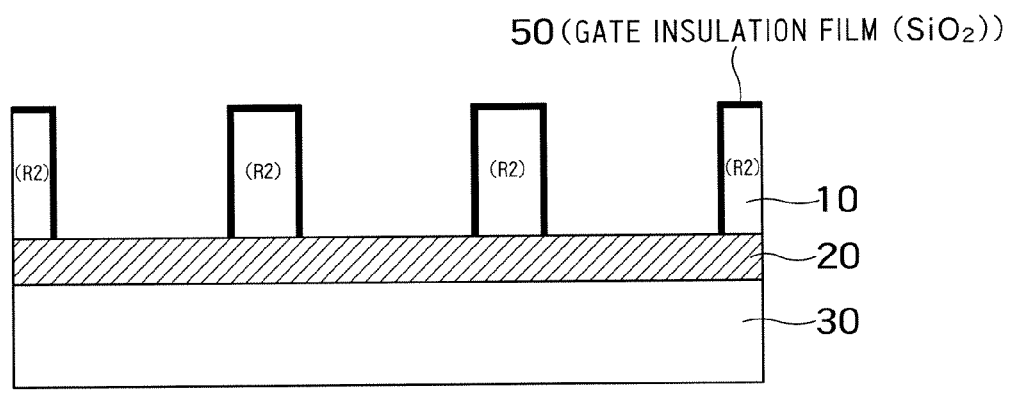
Figure 6:
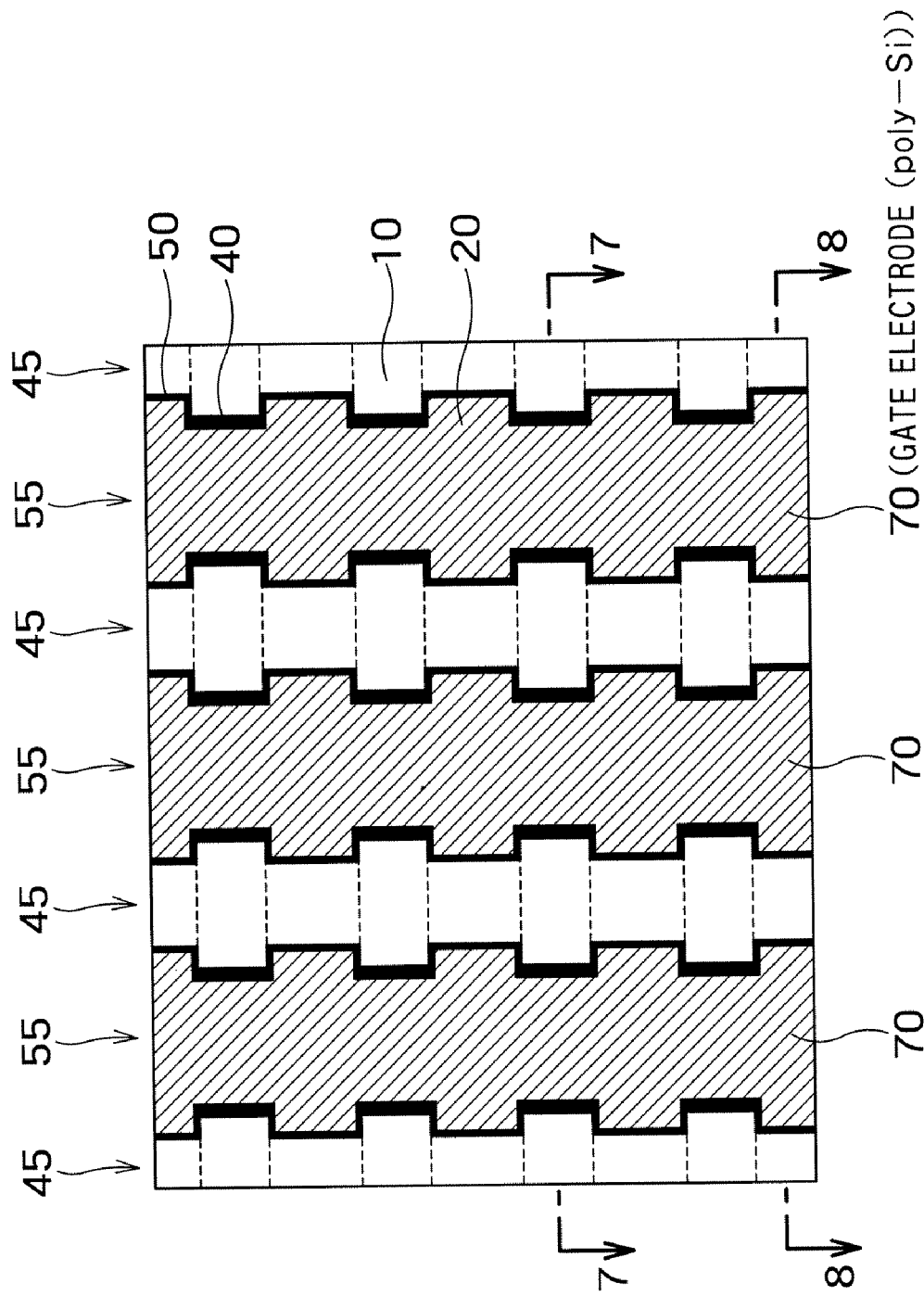
FIG. 6 is a top plan view showing a method of manufacturing a semiconductor memory device following FIG. 5A.

Next, as shown in FIG. 5A and FIG. 5B, a gate insulation film 50 is formed on the side surfaces of the floating body region R2. The gate insulation film 50 is a silicon oxide film, for example. The gate insulation film 50 has a film thickness of 10 nm, for example, which is smaller than that of a thickness of the protection film 40. FIG. 5B is a cross-sectional view of the configuration taken along a line 5B-5B shown in FIG. 5A.

Figure 7:
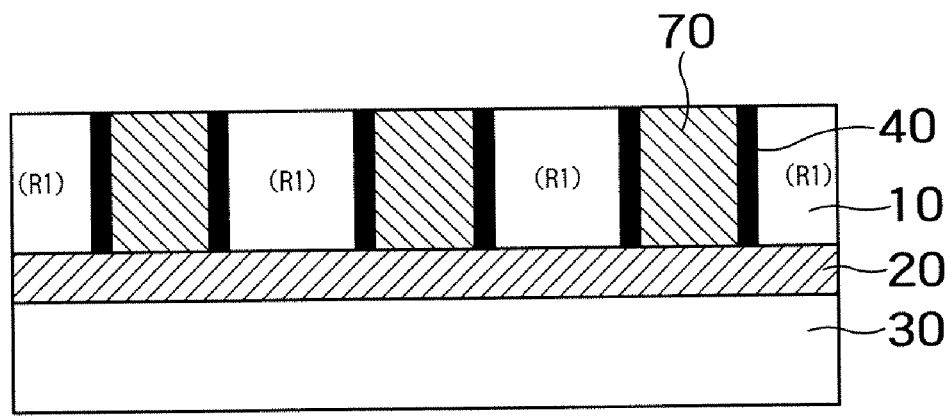
FIG. 7 is a cross-sectional view of the configuration shown in FIG. 6 cut along a line 7-7.
Figure 8:
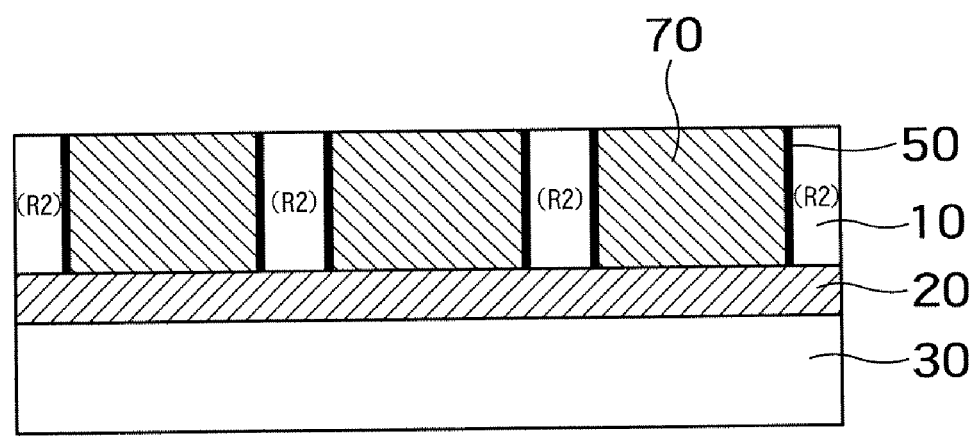
FIG. 8 is a cross-sectional view of the configuration shown in FIG. 6 cut along a line 8-8.

Next, a doped polysilicon 70 is deposited as a gate electrode material on the trench 55, thereby filling the trench 55 with the polysilicon 70. The doped polysilicon 70 is polysilicon having an N-type impurity doped in high concentration. This polysilicon 70 is polished according to a CMP (chemical mechanical polishing) method, until when the upper surface of the FIN-type semiconductor layer 45 is exposed. With this arrangement, a configuration as shown in FIG. 7 and FIG. 8 is obtained. FIG. 7 is a cross-sectional view of the configuration shown in FIG. 6 cut along a line 7-7. FIG. 8 is a cross-sectional view of the configuration shown in FIG. 6 cut along a line 8-8. The polysilicon 70 has a configuration in which plural gate electrodes are connected in a line shape. The polysilicon 70 works as a front gate and a back gate of the memory cell, and also functions as a word line of the FBC memory device.

Figure 9:
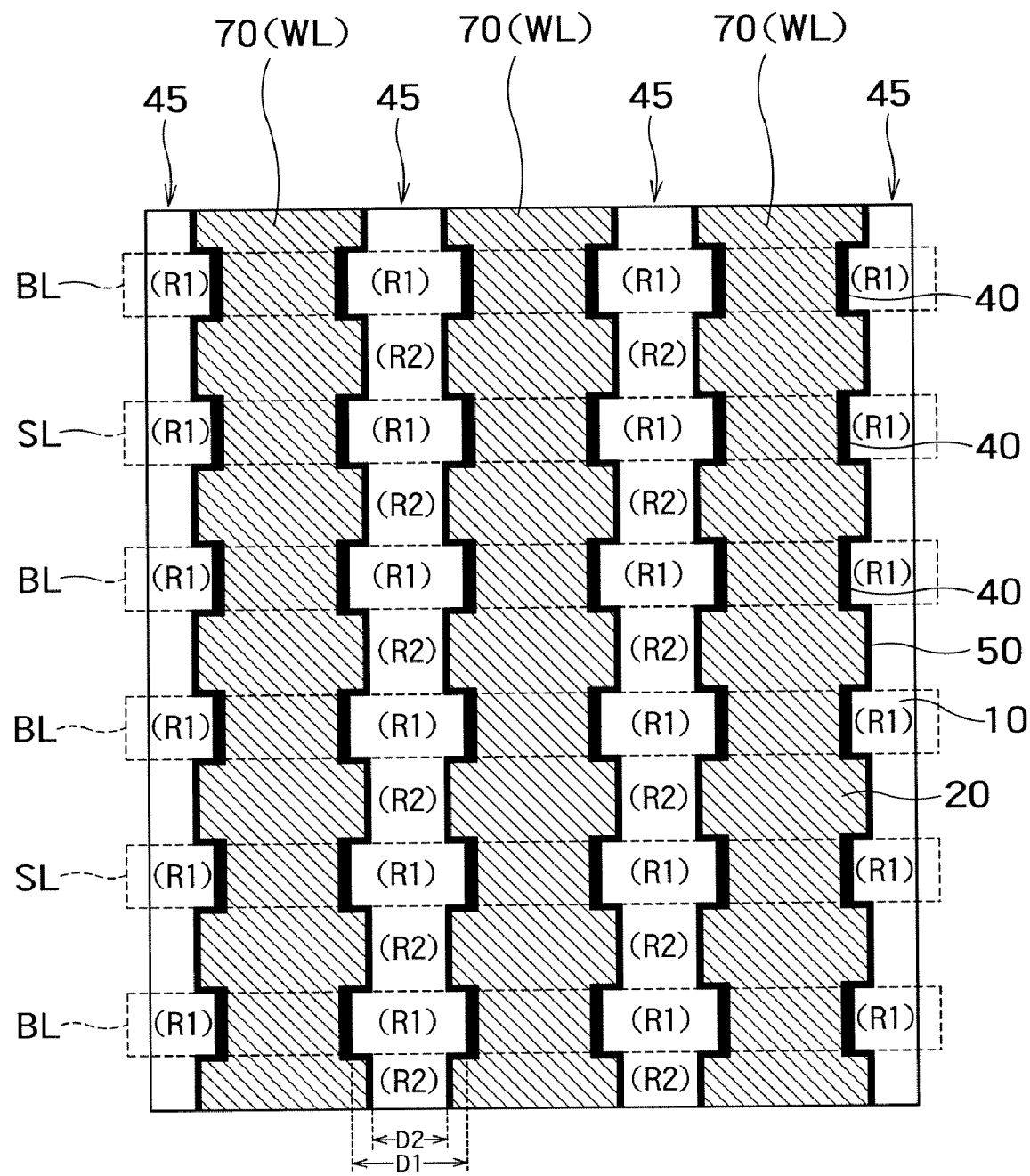
FIG. 9 is a top plan view showing a method of manufacturing a semiconductor memory device following FIG. 6.

Then, the impurity within the polysilicon 70 is activated by RTA (rapid thermal annealing) of 1,000° C. or above. Next, polysilicon (not shown) in other than the memory cell region is processed by using a photolithographic technique and RIE, thereby forming a wiring. As shown in FIG. 9, bit lines BL and source lines SL are formed. In this case, because the RTA is used, there occurs no impurity diffusion from the source/drain region to the channel region.

Figure 10:
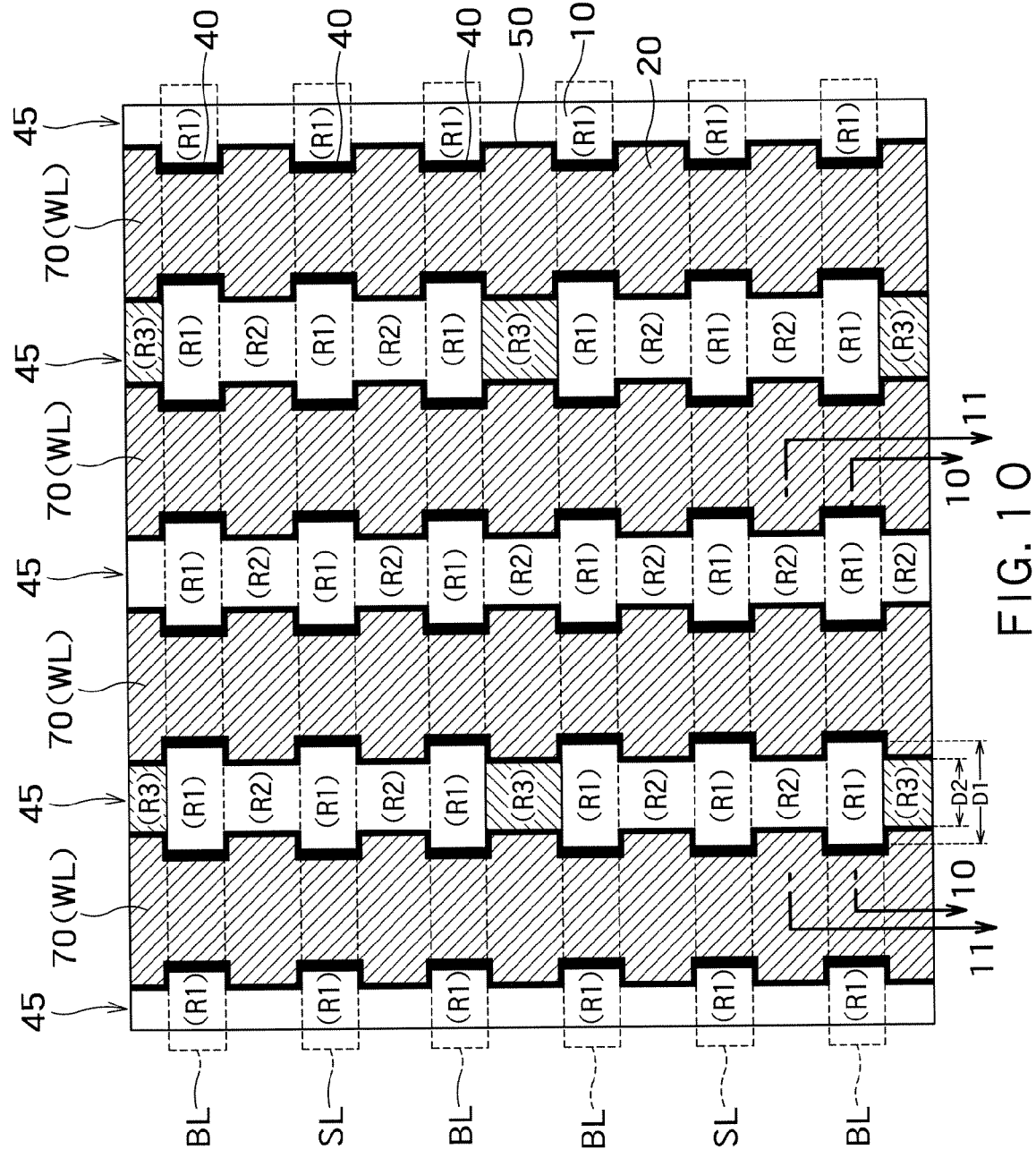
FIG. 10 is a top plan view showing a method of manufacturing a semiconductor memory device following FIG. 9.

Next, as shown in FIG. 10, a semiconductor layer (a silicon pillar) 45 between adjacent bit line contact regions is etched by using a photolithographic technique and RIE. Accordingly, memories are isolated by elements in each bit unit, as a third etching process. In the third etching process, the BOX layer 20 is exposed between the adjacent bit line contact regions, as shown by a region R3 in FIG. 10.

Next, a silicon oxide is deposited in a thickness of 300 nm or more to form an inter-layer insulation film 25. Furthermore, a contact hole 26 is formed between the inter-layer insulation films 25. In the present embodiment, because the source/drain region R1 has a large area, the contact hole 26 having a large diameter or a large size can be formed between the source/drain regions R1.

Next, a metal film 27 is deposited to fill the contact hole 26. The metal film 27 is made of aluminum, copper, or the like. The metal film 27 is etched according to a photolithographic technique and wet etching, thereby forming bit lines BL and source lines SL. Accordingly, the FBC memory device is completed.

Figure 11:
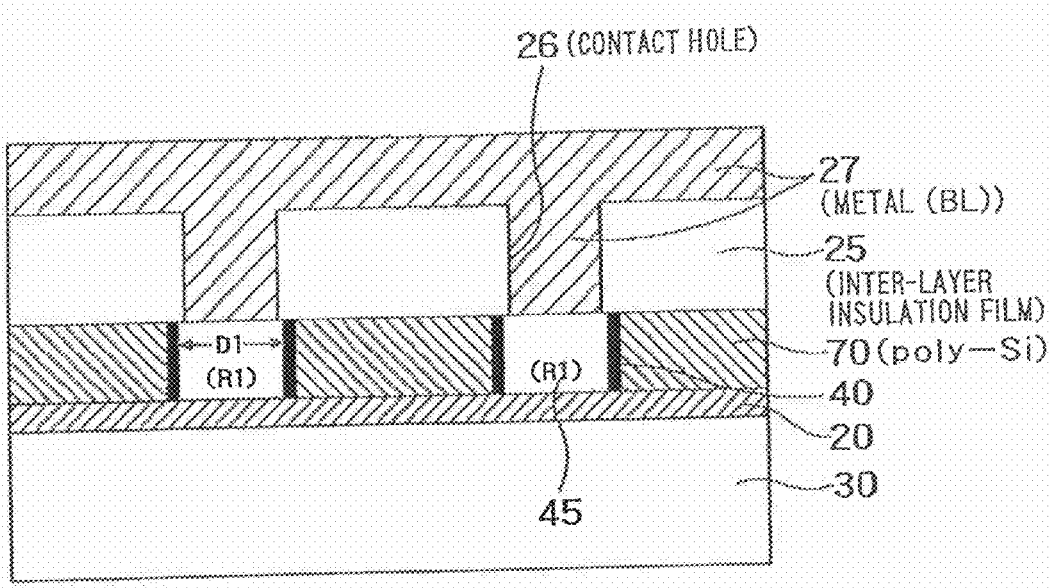
FIG. 11 is a cross-sectional view of the configuration shown in FIG. 10 along a line 10-10.
Figure 12:
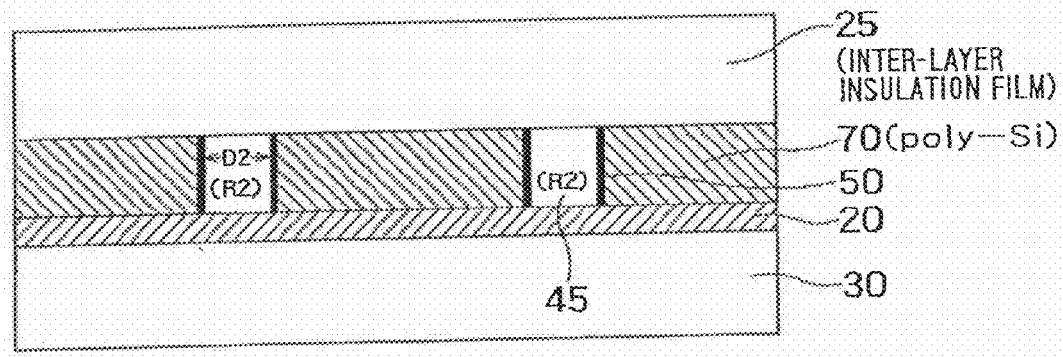
FIG. 12 is a cross-sectional view of the configuration shown in FIG. 11 along a line 11-11.

FIG. 11 is a cross-sectional view of the configuration shown in FIG. 10 along a line 10-10, and FIG. 12 is a cross-sectional view of the configuration shown in FIG. 11 along a line 11-11. The bit lines BL and the source lines SL are directly contacted to the drain regions and the source regions, respectively. Because the contact area between the source/drain region R1 and the contact hole 26 is large, resistance between the bit line BL and the drain region and resistance between the source line SL and the source region become low. The polysilicon 70 is connected to a metal wiring of the upper layer at the outside of the memory cell region (not shown).

According to the present embodiment, the FIN-type semiconductor layer 45 is formed in plural etching processes. Therefore, impurity for the source/drain regions can be implanted from the side surfaces of the source/drain regions R1. As a result, impurity in the source/drain regions R1 can be diffused and activated by annealing at a lower temperature and in a shorter time than conventional practices. Furthermore, diffusion of impurity from the source/drain regions into the channel regions can be suppressed.

According to the present embodiment, the source/drain region R1 and the floating body region R2 of the FIN-type semiconductor layer 45 are formed in mutually different etching processes. Therefore, in the cross section parallel with the surface of the BOX layer 20, the thickness (the width) D1 of the source/drain region R1 and the thickness (the width) D2 of the floating body region R2 can be differentiated. As a result, the signal amount which is difference between data "0" and data "1" from a memory cell can be increased, while maintaining the contact resistance of the source/drain region R1 at a low level.

According to the present embodiment, the source/drain region R1 and the floating body region R2 of the FIN-type semiconductor layer 45 are formed in mutually different etching processes. Therefore, the protection film 40 having a relatively large thickness can be formed on the side surface of the source/drain region R1, and the gate insulation film 50 having a relatively small thickness can be formed on the side surface of the floating body region R2. When the protection film 40 has a large film thickness, a distance between the source/drain region R1 and the word line WL becomes large, and interaction between the source/drain region R1 and the word line WL becomes small, thereby obtaining the effect of suppressing GIDL (Gate Induced Drain Leakage).

The FBC memory device manufactured by a manufacturing method according to the present embodiment includes the BOX layer 20 as an insulation layer, the FIN-type semiconductor layer 45, the gate insulation film 50, the gate electrode 70, the source line SL as a source electrode, and the bit line BL as a drain electrode, as shown in FIG. 11 and FIG. 12.

The FIN-type semiconductor layer 45 is provided on the BOX layer 20. The FIN-type semiconductor layer 45 includes the floating body region R2 that is in the electrically floating state, and the source/drain regions R1 at both sides of the floating body region R2. In the cross-section of the FIN-type semiconductor layer 45 that is cut in parallel with the surface of the BOX layer 20, the thickness D2 of the FIN-type semiconductor layer 45 in the floating body region R2 is smaller than the thickness D1 of the FIN-type semiconductor layer 45 in the source/drain region R1.

The gate insulation film 50 is formed on both side surfaces of the floating body region R2. The gate electrode 70 is provided on both side surfaces of the floating body region R2 via the gate insulation film 50. The protection film 40 is provided on the side surface of the source/drain region R1. The protection film 40 has a larger film thickness than the gate insulation film 50. For example, the thickness of the protection film 40 is about 20 nm, and the thickness of the gate insulation film 50 is 10 nm.

The bit line BL and the source line SL are contacted to the upper surface of the source/drain region R2. Because the thickness D1 of the source/drain region R1 is larger than the thickness D2 of the floating body region R2, the contact area on the upper surface of the source/drain region R2 can be increased. Accordingly, the bit line BL and the source line SL are connected to the source/drain region R1 in low contact resistance. Because the thickness D2 of the floating body region R2 can be decreased without considering the thickness of the source/drain region R1, the signal amount which is difference between data "0" and data "1" from a memory cell can be increased.

The FBC memory device can store binary data ("0" or "1"), depending on the charge stored in the floating body region R2. The FBC memory device according to the present embodiment includes the gate electrodes 70 on both side surfaces of the floating body region R2, and the thickness D2 of the floating body region R2 is relatively small. Therefore, the FBC memory device according to the present embodiment can be a full-depletion type FBC memory device. Accordingly, a difference between a signal voltage "0" and "1" from the memory cell can be increased.

The invention claimed is:
1. A semiconductor device comprising:
an insulation layer;
a FIN-type semiconductor layer provided on the insulation layer and including a floating body region in an electrically floating state and including a source region and a drain region at both sides of the floating body region;
gate insulation films provided on both side surfaces of the floating body region;

gate electrodes provided on both side surfaces of the floating body regions via the gate insulation films, and extending in a direction in which the FIN-type semiconductor layer extends;

a source electrode and a drain electrode respectively contacting with the upper surface of the source region and the drain region; and protection films provided between a side surface of the source region and one of the gate electrodes and between a side surface of the drain region and one of the gate electrodes, one of the protection films contacting the side surfaces of the source region, and the other of the protection films contacting the side surface of the drain region, wherein in the cross section of the FIN-type semiconductor layer in parallel with the surface of the insulation layer, a thickness of the FIN-type semiconductor layer in the floating body region is smaller than a thickness of the FIN-type semiconductor layer in the source and the drain regions, and thickness of the protection films in a direction perpendicular to the side surfaces of the source or the drain region is greater than thickness of the gate insulation films in a direction perpendicular to the side surfaces of the floating body region.

2. The semiconductor device according to claim 1, wherein the semiconductor device stores binary data on the basis of a number of charges stored in the floating body region.

3. The semiconductor device according to claim 1, wherein the semiconductor device is an FBC memory device having the FIN-type semiconductor layer as a part of a memory cell.

4. The semiconductor device according to claim 1, wherein the semiconductor device is a fully-depleted type FBC memory device having the FIN-type semiconductor layer as a part of a memory cell.

5. The semiconductor device according to claim 1, wherein the source region and the drain region are formed by an N-type semiconductor.

6. The semiconductor memory device according to claim 1, wherein each of the gate electrodes is provided between a side surface of the source region and a side surface of the drain region.

7. The semiconductor memory device according to claim 1, wherein in the cross section of the FIN-type semiconductor layer in parallel with the surface of the insulation layer, a thickness of all of the FIN-type semiconductor layer in the source and the drain regions is larger than a thickness of the FIN-type semiconductor layer in the floating body region, and the protection films are only provided on side surfaces of the source and the drain regions.

* * * * *